(12) United States Patent
Aherne

(10) Patent No.: US 9,112,496 B2
(45) Date of Patent: Aug. 18, 2015

(54) COMMON MODE VOLTAGE MULTIPLEXER

(71) Applicant: David Aherne, Limerick (IE)

(72) Inventor: David Aherne, Limerick (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/245,125

(22) Filed: Apr. 4, 2014

(65) Prior Publication Data

US 2014/0312935 A1    Oct. 23, 2014

Related U.S. Application Data

(60) Provisional application No. 61/813,252, filed on Apr. 18, 2013.

(51) Int. Cl.
*G06F 3/00*    (2006.01)
*H03K 17/081*    (2006.01)
*G06F 13/38*    (2006.01)

(52) U.S. Cl.
CPC ................ *H03K 17/08104* (2013.01)

(58) Field of Classification Search
None
See application file for complete search history.

(56) References Cited

U.S. PATENT DOCUMENTS 8,222,948 B2   7/2012   Birk
2011/0227891 A1*   9/2011   Lee .............................. 345/211

* cited by examiner

*Primary Examiner* — Scott Sun
(74) *Attorney, Agent, or Firm* — Kenyon & Kenyon, LLP

(57) ABSTRACT

A circuit and a system that uses the circuit for connecting a plurality of input channels to a receiving device. The circuit includes a plurality of DMOS switches, each of which connects a respective one of the input channels to the receiving device in response to a respective control signal. The control signals are referenced to a ground signal. Each input channel includes a common mode voltage that is non-referenced to the ground signal. The circuit also includes a switch driver that generates the control signals such that the input channels are activated one at a time.

27 Claims, 6 Drawing Sheets

US 9,112,496 B2

COMMON MODE VOLTAGE MULTIPLEXER

CROSS-REFERENCE TO RELATED APPLICATIONS

This application claims the benefit, under 35 U.S.C. §119 (e), of U.S. Provisional Patent Application No. 61/813,252 filed Apr. 18, 2013, the content of which is hereby incorporated by reference in its entirety.

BACKGROUND INFORMATION

Electrical systems often include components in different locations. Each component may operate relative to a reference voltage such as a circuit ground, building ground or earth ground. If the reference voltage is different between components, the components may not be able to interact properly. In a measurement system, measurements may be performed by sensors at different locations, e.g., temperature measurements performed by thermocouples in different parts of a factory. Each sensor may output its data to a respective channel, and all the channels may be multiplexed to a measuring device located elsewhere in the factory, such that only one selected channel is output to the measuring device at any particular time. As a result of capacitive, inductive or electromagnetic coupling, each channel may include a common mode voltage (CMV) in addition to voltages corresponding to sensor data. In the case of thermocouples, the input may be on the order of 10 µVs, whereas other sensors may provide a voltage input between +10 V and −10 V that sits on top of the CMV. In comparison, the CMV can be quite large relative to the input signal. The CMV may vary between channels and may also be different from the voltage of a ground signal used by the measuring device. To ensure proper operation of the measuring device, the ground signal is typically adjusted towards the CMV of the selected channel. A supply voltage to the measuring device may be generated with reference to the ground signal. Therefore, when the ground signal is near CMV, the supply voltage is also near the CMV, i.e., at a voltage level suitable for driving the measuring device when the input to the measuring device includes the same CMV.

One method for connecting channels to the measuring device is to use a PhotoMOS as a switch for each channel. A photodiode within the PhotoMOS generates a gate-to-source voltage (Vgs) to turn on the PhotoMOS, thereby connecting the output of the sensor to the input of the measuring device. The Vgs is generated relative to the CMV of the channel to which the PhotoMOS is connected. PhotoMOS are relatively large devices in part because of the sizes of the photodiodes and associated hardware (e.g., a light-emitting diode to activate the photodiode). PhotoMOS also need to be controlled (turned on or off) using respective control lines in a one-to-one manner Therefore, PhotoMOS may not be suitable for implementing a multiplexer when there are many channels or when there are space constraints. Accordingly, a need exists for improved ways to multiplex channels that have different CMVs.

SUMMARY

Example embodiments of the present invention relate to a multiplexer for connecting channels that have different CMVs, in particular, an analog multiplexer for use in the presence of high CMVs.

Example embodiments of the present invention relate to systems that use multiplexers to connect signals from a plurality of channels to a receiving device connected to the channels.

In one embodiment, a switch and its control devices are designed so that the switch stays off in the presence of CMVs, until the switch is commanded to turn on. When the switch is turned on, it connects a respective channel to a receiving device, which can be a measuring device. The switch is kept off while a circuit adjusts a ground signal towards the CMV of the respective channel. The ground signal may be used by the measuring device. Therefore, adjusting the ground signal to approximately the CMV allows the measuring device to operate properly. The ground signal may also be used as a reference for the control signals of the switch. Therefore, adjusting the ground signal to approximately the CMV also allows the switch to be turned on without dangerously high voltages, e.g., a high gate-to-source voltage when the switch is implemented using MOS devices.

DETAILED DESCRIPTION OF EXAMPLE EMBODIMENTS

The present invention relates to a multiplexer (MUX) for connecting channels that have different CMVs. The MUX may include a set of switches to connect the channels to a receiving device, a switch driver to control the switches, a circuit to move a ground signal to a CMV, and a circuit to detect when the ground signal has moved to the CMV. The present invention also relates to systems that use MUXs to connect signals from a plurality of channels to a receiving device connected to the channels.

Figure 1:
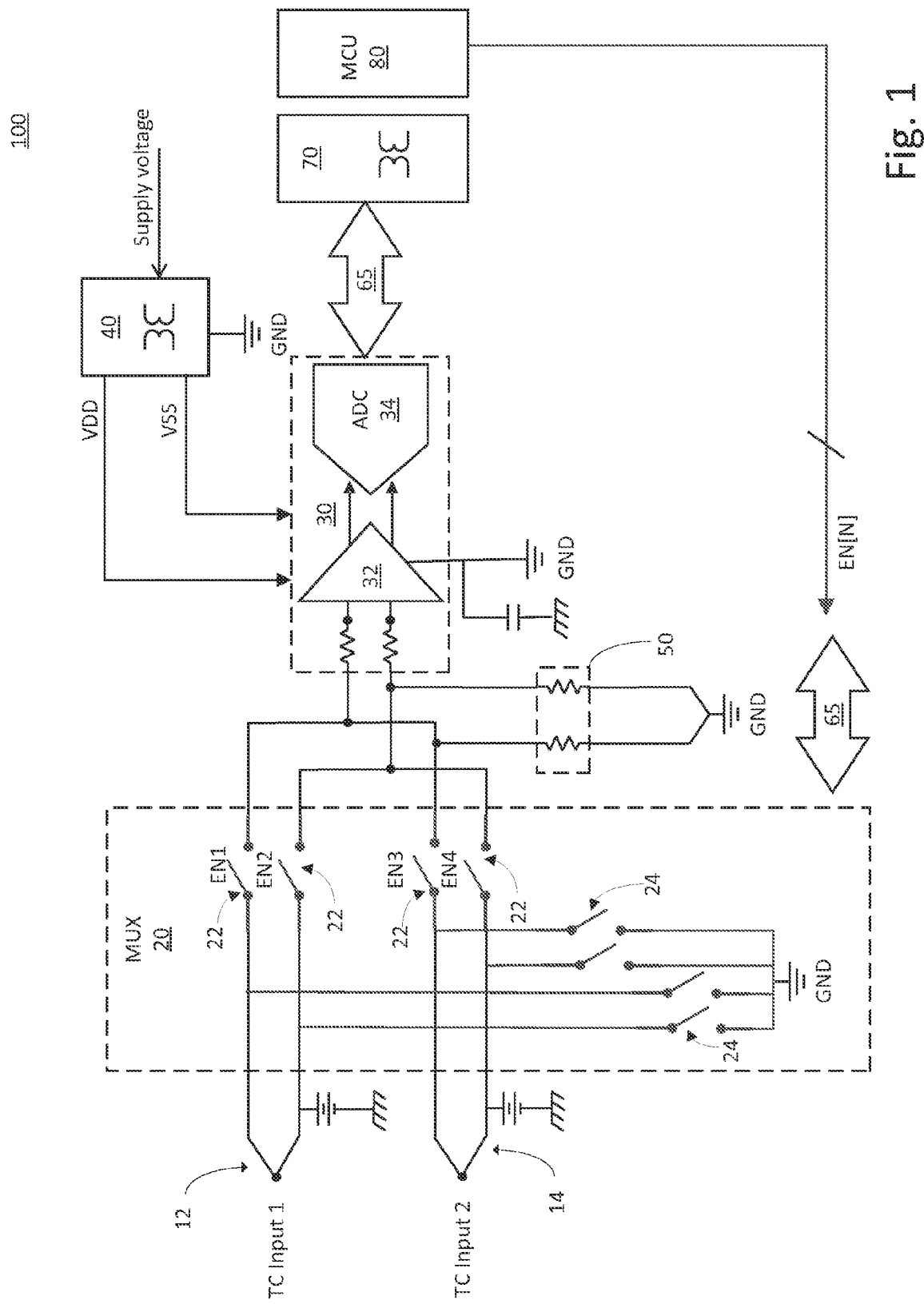
FIG. 1 shows an example embodiment of a system according to the present invention.

FIG. 1 shows an example embodiment of a system 100 according to the present invention. The system 100 includes a plurality of measuring channels 12, 14. For simplicity, only two channels are shown. The channels 12, 14 are connected by a MUX 20 to a measuring device 30 based on an enabling signal "EN" from a microcontroller (MCU) 80.

Each channel 12, 14 includes two lines for transmitting sensor data from a respective sensor. The sensor data for channel 12 is labeled "TC Input 1" and the sensor data for channel 14 is labeled "TC Input 2". A CMV is symbolically represented by a DC voltage source between each channel and earth ground. The values of the DC voltage sources, and therefore the CMV at each of the inputs TC Input 1 and TC Input 2 may differ. However, it will be understood that in reality the CMV may behave like an AC source that changes at a particular frequency.

Each channel includes two lines so that the sensor data can be transmitted differentially, with one line serving as a positive lead and the other line being a negative lead, and neither of the leads being connected to the ground signal "GND" (to which the measuring device 30 is connected). Differential mode allows for more accurate measurement because the measuring device 30 can reject the CMV, whose value is equal to half the sum of the voltages on the positive and the negative leads. The CMV at the input of the measuring device 30 (i.e., the input of amplifier 32) can be measured by shorting the positive and negative leads, e.g., using a DC element such as a wire or low resistance resistor, so that the differential voltage is zero and any residual voltage will correspond to the CMV. Common mode rejection is known in the art and therefore will not be described herein.

Although example embodiments are described in connection with differential measurement systems, it will be appreciated that the example embodiments may also be implemented with non-differential (i.e., single-ended) measurement systems. For example, in a Non-Referenced Single-Ended (NRSE) system, the second lead provides a voltage reference that is shared by all channels. Like the differential system, the second lead is not connected to GND. In principle, the example embodiments are also applicable to NRSE systems.

The measuring device may include the amplifier 32, which can be an operational amplifier, and which amplifies a signal received via a selected channel to generate an input to an analog-to-digital converter (ADC) 34.

The ADC 34 converts the analog voltage from the amplifier 32 into a digital value representing a measured value, e.g., a temperature value, and outputs the digital value to the MCU 80 via an interface 65. The interface 65 may be a serial interface.

An optocoupler or transformer 70 may be located between the interface and the MCU 80 and functions as an isolation barrier that converts the signals received from the ADC 34 to levels that are suitable for the MCU (e.g., to a signal between 0 and 5 V). This barrier protects the MCU 80, as well as users who interact with the MCU 80, from high voltages.

The MCU 80 generates the EN signal to control the selection of the switches 22 by the MUX 20. The EN signal can be an N-bit signal that is decoded at the MUX 20 to determine which switch to connect to the amplifier 32. Each switch 22 may have a respective activating signal, EN1, EN2, EN3, EN4, which is output based on the decoding of the EN signal. In one embodiment, the EN signal is output using the serial interface 65, which obviates the need for additional control lines to the switches. As an alternative to sharing the serial interface 65, a separate isolation barrier may be provided for controlling the switches 22. The MCU 80 may provide additional control signals (not shown) to the measuring device 30, e.g., control signals via the serial interface 65 to instruct the ADC 34 when to begin converting. The MCU 80 may also process the result of the conversion, e.g., by sending a control signal to shut off a motor when the ADC output indicates that the temperature of the motor is too high.

When the next switch 22 is selected, the MUX 20 turns off the currently selected switch 22 and adjusts (floats) the ground signal GND towards the CMV of the newly selected channel. The adjustment of GND towards CMV by the MUX is described in connection with FIGS. 2 and 4, which use different circuitry for performing the adjustment. In response to determining that the voltage value of GND is at approximately the same level as the CMV of the newly selected channel, the MUX 20 activates (turns on) the switch 22 of the newly selected channel to connect the selected channel to the amplifier 32. This ensures that the switch 22 of the newly selected channel is able to turn on, as well as protects the next switch from unnecessarily high voltages. As explained below in connection with an alternative embodiment, the MUX can be implemented such that adjusting GND to CMV is not required prior to activating the switch 22 when there is an alternative way of ensuring that the voltages applied to the switch are at an appropriate level. Depending on the design of the switch, it may not even be necessary to protect the switch against the high voltages associated with the channels 12, 14. However, it will be appreciated that the protection provided by the example embodiments described herein may allow for ease of designing the switches 22. In addition to the switches 22, the MUX 20 may also include a corresponding switch 24 for each channel line and each switch 22. The MUX 20 turns on one switch 24 so as to connect the selected channel to GND while leaving the unselected channels floating. As shown in FIG. 1 and throughout the drawings, intersecting signal lines do not necessarily mean that the lines are connected together. For example, as explained above, each switch 24 has its own corresponding channel line and corresponding switch 22.

The measuring device 30 is powered by a positive supply voltage "VDD" and a negative supply voltage "VSS". Both VDD and VSS may be generated by a floating voltage supply device 40 based on a supply voltage signal, e.g., a 24 V AC signal. The supply device 40 may pass the supply voltage signal through a transformer to convert the supply voltage signal to a voltage level suitable for driving the measuring device 30. Additionally, the supply device 40 may rectify the transformed voltage signal and perform voltage regulation to generate VDD and VSS as substantially constant DC signals. VDD and VSS are generated with reference to the ground signal "GND". As a result of the MUX 20 adjusting GND towards the CMV of a selected channel, VDD and VSS are floated to the level of the CMV for the selected channel, which in turn allows the measuring device 34 to accurately perform a measurement of the selected channel. If VDD and VSS were not floated to the level of the CMV, measurement errors could result when the amplifier 32 is saturated, e.g., when VDD exceeds the 24 V supply voltage. Damage to the amplifier 32 or other measuring device components could also occur.

A common mode detector 50 may be formed by a pair of matched resistors that pull GND to halfway between the two lines of the selected channel, i.e. to the CMV of the selected channel. This ensures that the input signal is biased around the CMV, which is then rejected by the amplifier 32. The pulling of GND by the common mode detector 50 occurs in response to the activation of the next switch 22, i.e., the switch 22 of the newly selected channel. When the next switch 22 is activated, the MUX 20 may no longer be required to adjust GND towards CMV, as that function is taken over by the common mode detector 50. This is because once the switches 22 are on, the resistors of the common mode detector 50 are connected to the CMV path and track the CMV, so the MUX does not need to adjust GND anymore.

Figure 2:
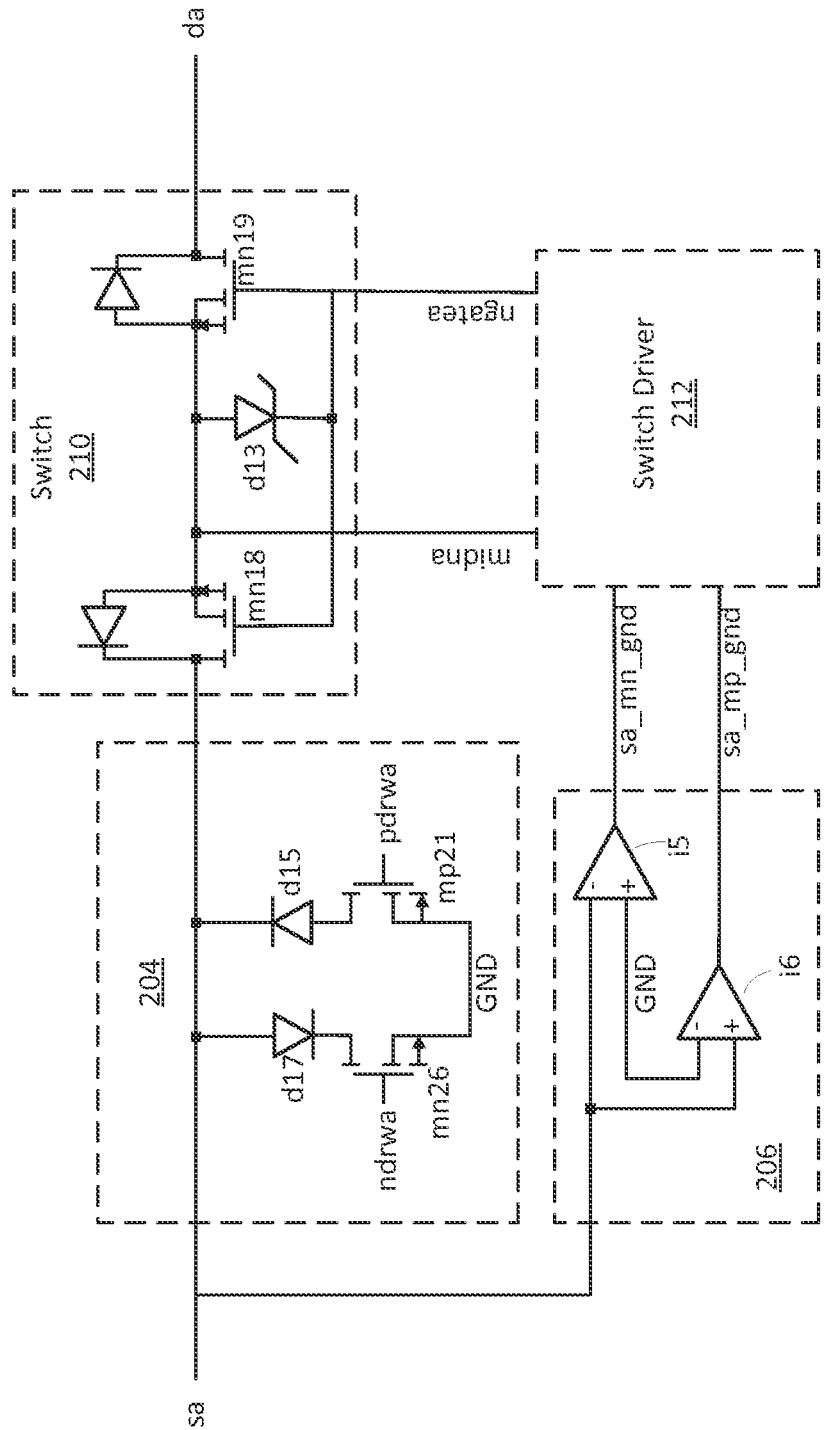
FIG. 2 shows an example embodiment of a single channel of a multiplexed switch architecture according to the present invention.

FIG. 2 shows an example embodiment of a single channel 200 of a multiplexed switch architecture according to the present invention. The devices shown in FIG. 2 may be packaged into an integrated circuit and combined with additional copies of the integrated circuit to form a MUX according to the present invention. Alternatively, the entire MUX can be formed as a single integrated circuit that includes multiple instances of the channel 200. As shown, the channel 200 includes an input labeled "sa" and an output "da". The input sa is connected to a respective channel 12, 14 and the output da is connected to the input of the measuring device 30. The channel 200 may include a circuit 204 that moves GND towards the CMV of the respective channel, a switch 210 (corresponding to a switch 22 in FIG. 1), a switch driver 212, and a circuit 206 that detects when GND is approximately equal to the CMV. The circuit 204 is one way of implementing the switch 24 in FIG. 1.

The switch 210 may be implemented using high voltage DMOS devices as switching elements. In the example embodiments described herein, the primary switching elements are two NDMOS devices mn18 and mn19 connected in series, so that the parasitic diodes of the NDMOS devices (shown using conventional diode symbols) are back-to-back, which prevents leakage current between sa and da. Alternatively, the switch 210 may be implemented using series-connected PDMOS or using series-connected NDMOS in parallel to series-connected PDMOS, as described in U.S. patent application Ser. No. 13/592,692. Since DMOS devices are typically restricted to 5.5 Vgs, a zener diode d13 may be placed between the common source of the NDMOS devices and the common gate of the NDMOS devices to protect the gate oxides of the NDMOS devices.

The switch 210 may be configured to be off by default. A native NMOS (mn16 in the switch driver of FIG. 3) may be connected between the lines labeled "midna" and "ngatea" to maintain 0 Vgs until the switch is commanded (via midna and ngatea) by the switch driver 212 to turn on. Ngatea is the common gate of the NDMOS transistors mn18 and mn19. To turn the switch off, 0 Vgs or a negative Vgs is maintained between midna and ngatea. To turn the switch on, a positive Vgs of greater than Vtn (the threshold voltage of mn18 and mn19) is maintained between midna and ngatea. Vtn is typically less than 1 V for an NDMOS transistor. The 5.5 Vgs restriction on DMOS devices means that a maximum Vgs of 5.5 V is allowed between midna and ngatea, i.e., ngatea can be a maximum of 5.5 V higher than midna.

The circuit 204 includes an NDMOS transistor mn26 in series with a diode d17. The cathode of the diode d17 is connected to the drain of mn26 These two devices combine to move GND towards a positive CMV. Mn26 is controlled by the signal labeled "ndrwa". Analogously, the circuit 204 includes a PDMOS transistor mp21 in series with a diode d15 to move GND towards a negative CMV. The anode of diode d15 is connected to the drain of mp21. The sources of mn26 and mp21 are both connected to GND. The diode d15 is a blocking diode that prevents current flow in the situation where the channel is not selected and GND is at a lower voltage than the CMV of the other channels. Similarly, the diode d17 prevents current flow when the channel is not selected and GND is at a higher voltage than the CMV of the other channels.

The circuit 204 operates as follows. When the switch is commanded on, mn26 and mp21 are both turned on, e.g., using GND +5 V as ndrwa and GND −5 V as pdrwa. If the input sa is more positive than GND, current will flow from sa into GND to move GND towards the CMV at sa. If sa is more negative than GND, current will flow from GND to sa to move GND towards the CMV. Ndrwa and prdwa may be generated by a decoder (not shown) that decodes the EN signal output by the MCU 80 in FIG. 1.

The circuit 206 is a detection circuit that may be implemented using two comparators i5 and i6, although the detection circuit can also be implemented without comparators. The ground signal GND is connected to a non-inverting input of i5 and to an inverting input of i6. The other inputs of i5 and i6 are connected to sa. Thus, one comparator determines whether the input is below GND, while the other comparator determines whether the input is above GND. The triggering thresholds of i5 and i6 may be set to account for the fact that GND may never be adjusted to be exactly equal to the CMV. For example, the diodes d15 and d17 in the circuit 205 may cause GND to never be less than one diode drop away from the CMV.

Figure 3:
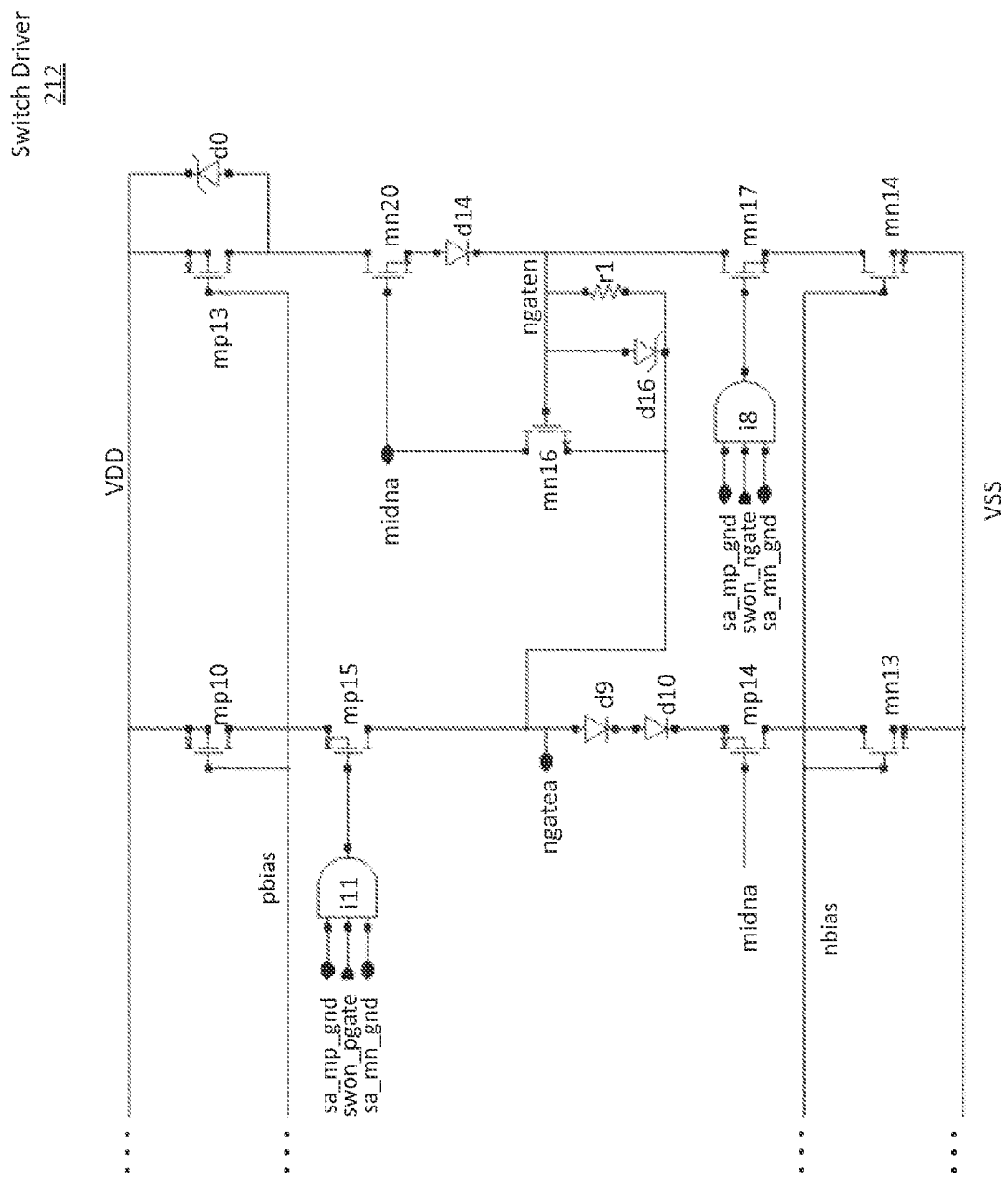
FIG. 3 shows an example embodiment of a switch driver according to the present invention.

FIG. 3 shows an example embodiment of the switch driver 212, which may include the following components:

Mp10 and mp13 are PMOS current sources, e.g., 5 V sources, that source current from the positive supply voltage VDD. Mp10 and mp13 are controlled by a bias current pbias.

D0 and d16 are zener diodes that clamp their respective anodes at approximately 5 V below their respective cathodes to protect the gate oxide of the transistor devices to which these zener diodes are associated. Thus, these zener diodes are analogous to the zener diode d13 in the switch 210.

Mp15 is a PDMOS that enables or disables the switch driver 212 based on the combination of the following signals: swonpgate, sa_mp_gnd and sa_mn_gnd. Sa_mp_gnd and sa_mn_gnd are shown in FIG. 2. Swonpgate and a complementary signal swon_ngate are signals that control the on/off behavior of the switch 210 based on the enabling signal EN in FIG. 1. If mp15_g is equal to VDD, then mp 15 is off If mp15_g is more than Vtp (the threshold voltage of mp15) lower than VDD, then mp15 is on. Mp15 also protects mp10 from high voltages.

D9, d10 and d14 are diodes used to create specific voltage drops within the switch driver 212.

Mp14 is a PDMOS used to bootstrap ngatea to a voltage equal to the sum of midna+Vtp+two diode drops, thus generating a Vgs to turn the switch on. Mp14 also protects mn13 from high voltages.

Mn13 and mn14 are NMOS current sources, e.g., 5 V sources, that sink current into VSS. Mn13 and mn14 are controlled by a bias current nbias.

Mn20 is an NDMOS used to bootstrap ngaten to a voltage equal to the difference of midna−Vtn−a diode drop. This will turn off mn16 when the switch is commanded on. Mn20 also protects mp13 from high voltages.

Mn16 is a native NMOS and is therefore on when it receives 0 Vgs. Mn16 is used to keep midna equal to ngatea when the switch is commanded off When the switch is commanded on a negative Vgs of approximately −1 v is used to turn mn16 off, thus allowing a positive Vgs between midna and ngatea.

R1 is a resistor that ensures 0 Vgs on mn16 when the switch is commanded off. This resistor can be overdriven by the driver circuit when the switch is commanded on.

Mn17 is an NDMOS used to enable or disable the switch driver based on the combination of signals swon_ngate, sa_mp_gnd and sa_mn_gnd. If the gate voltage of mn17 equals VSS then mn17 is off. If the gate voltage of mn17 is more than Vtn higher than VSS then mn17 is on. Mn17 also protects mn14 from high voltages.

AND gates i11 and i8 represent combinational logic used to combine sa_mp_gnd and sa_mn_gnd with the driver control signals to ensure the switch does not turn on until GND is approximately equal to the CMV of the selected channel.

The switch driver 212 as shown in FIG. 3 operates using the same bootstrapping principles as a switch driver described in U.S. Pat. No. 8,222,948. Mn14, mn17, d14, mn20 and mp13 respectively perform the same functions as I1, N1, R1 and N3 in FIG. 6 of U.S. Pat. No. 8,222,948. However, it will be apparent that the switch circuits are not identical. For example, Mn13, mp14, d9, d10, mp15 & mp10 are the inverse of FIG. 6 (i.e. for driving an Ndmos switch instead of a Pdmos switch). Further, the native NMOS mn16, d16 and r1 have been added to replace N2 and INV. This substitution results in the default state of the switch being off, so that even if the power supply is not present, the switch will remain off—a desirable property in many applications as it improves the fault tolerance of the system, e.g., if the power supply is suddenly lost the switch will automatically turn itself off, thereby protecting the amplifier 32, the ADC 34, and other devices that may be connected to the switch.

The switching channel 200 may operate as follows. The native NMOS mn16 is on by default to maintain 0 Vgs on the switch 210 so that the switch 210 is off by default. When the switch is commanded on, ndrwa and pdrwa are generated to turn on the circuit 204 to move the floating supply GND to the CMV of the selected channel.

The circuit 206 detects when GND is approximately equal to the CMV, at which point the floating supply signals VSS and VDD will also be sitting around the CMV. In response to detecting this condition, the circuit 206 sends a signal to activate the switch driver 212.

The switch driver 212, in response to the signal from the circuit 206, turns on the switch 212 using control signals midna and ngatea, both of which are generated using the floating supply voltages VSS and VDD. As mentioned earlier, VDD and VSS are generated with reference to GND. Therefore, the control signals midna and ngatea are also referenced to GND. Once the switch is on, ndrwa and pdrwa turn off the circuit 204, the common mode detector 50 takes over the task of bringing GND toward the CMV, and the system is allowed to settle, e.g., when the voltage level of GND has stabilized, before the MCU 80 commands the measuring device 30 to perform a measurement of the selected channel.

Figure 4:
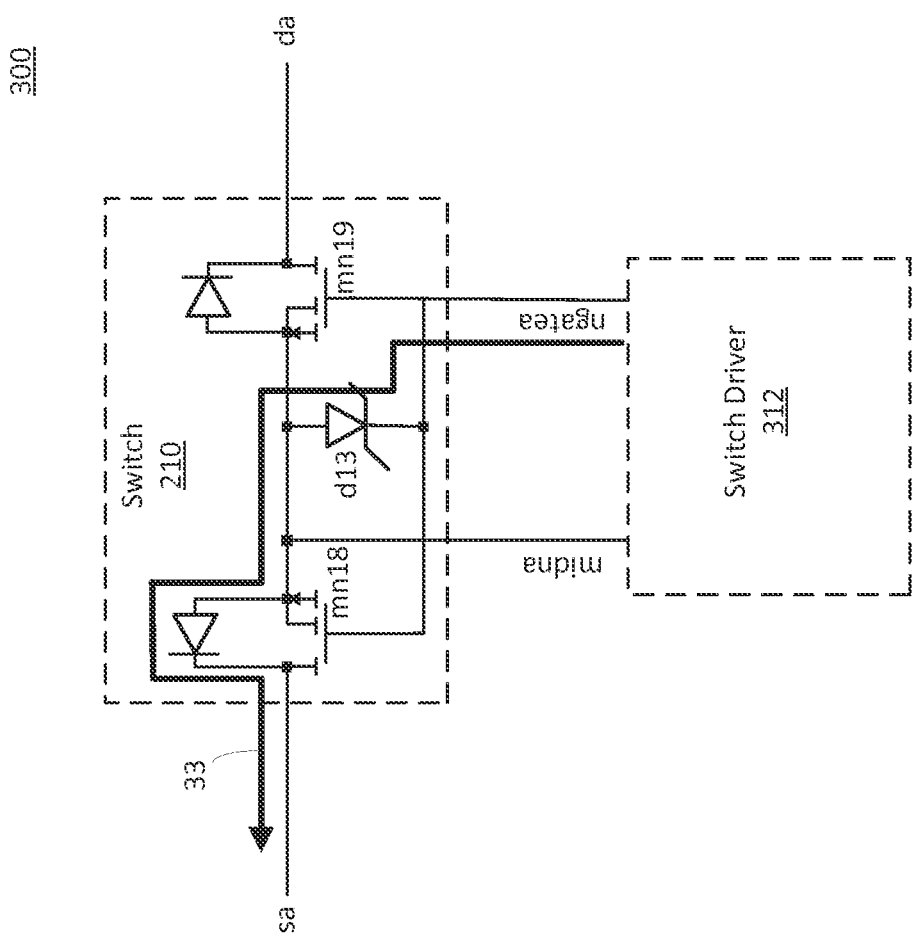
FIG. 4 shows another example embodiment of a single channel of a multiplexed switch architecture according to the present invention.

FIG. 4 shows an example embodiment of a single channel 300 of a multiplexed switch architecture according to the present invention. Unlike the channel 200 in FIG. 2, the channel 300 does not include the circuit 204 to move GND to the CMV and the detector circuit 206, and is therefore easier to implement, but may not be as accurate as the channel 200. Instead of the circuit 204, GND is moved to the CMV by using a parasitic path to pull the positive supply VDD towards the CMV. The channel 300 may operate as follows. When the switch is off, midna will be approximately equal to the most negative of sa and da due to the parasitic diodes on mn18 and mn19. Therefore, when the input sa is at a voltage more positive than both the positive supply VDD and the output da, midna will be approximately equal to da. In a multiplexed configuration such as the embodiments described herein, da will already be within the floating supply range, which may have been set by a previously selected channel. Even if all channels are off, if GND is at a lower voltage than sa, then midna will be approximately equal to da, which in turn will be approximately equal to GND. This is achieved by the resistors of the common mode detector 50. Therefore, the switch 210 can be immediately turned on without being in danger of unnecessarily high voltage. The channel 300 includes a switch driver 312, which is analogous to the switch driver 212 of FIG. 2. Since the channel 300 does not include the circuits 204 and 206, the switch driver 312 activates the switch 210 without regard for whether the ground signal is at a voltage approximately equal to the CMV of the channel.

When the switch is off and the input sa is lower than both the lowest supply voltage (e.g., VSS) and da, midna will be approximately equal to sa, which is below the minimum supply voltage. When the switch driver is activated in this situation, the zener diode d13 between ngatea and midna will breakdown because of the highly negative voltage so that current flows from ngatea to sa, and thus from the positive supply VDD, through the switch driver, through zener diode d13, and the parasitic diode to sa, as shown by the arrow 33 in FIG. 4. This pulls the positive supply VDD towards CMV to allow the switch to be turned on safely. Pulling VDD causes GND to move along with VDD. For example, if the potential difference between VDD and GND is +10 V, then +10 V will be maintained between VDD and GND if VDD is pulled towards the CMV. The same is true for VSS. Once the switch is turned on, the common mode detector 50 can takeover by adjusting GND towards CMV.

Figure 5:
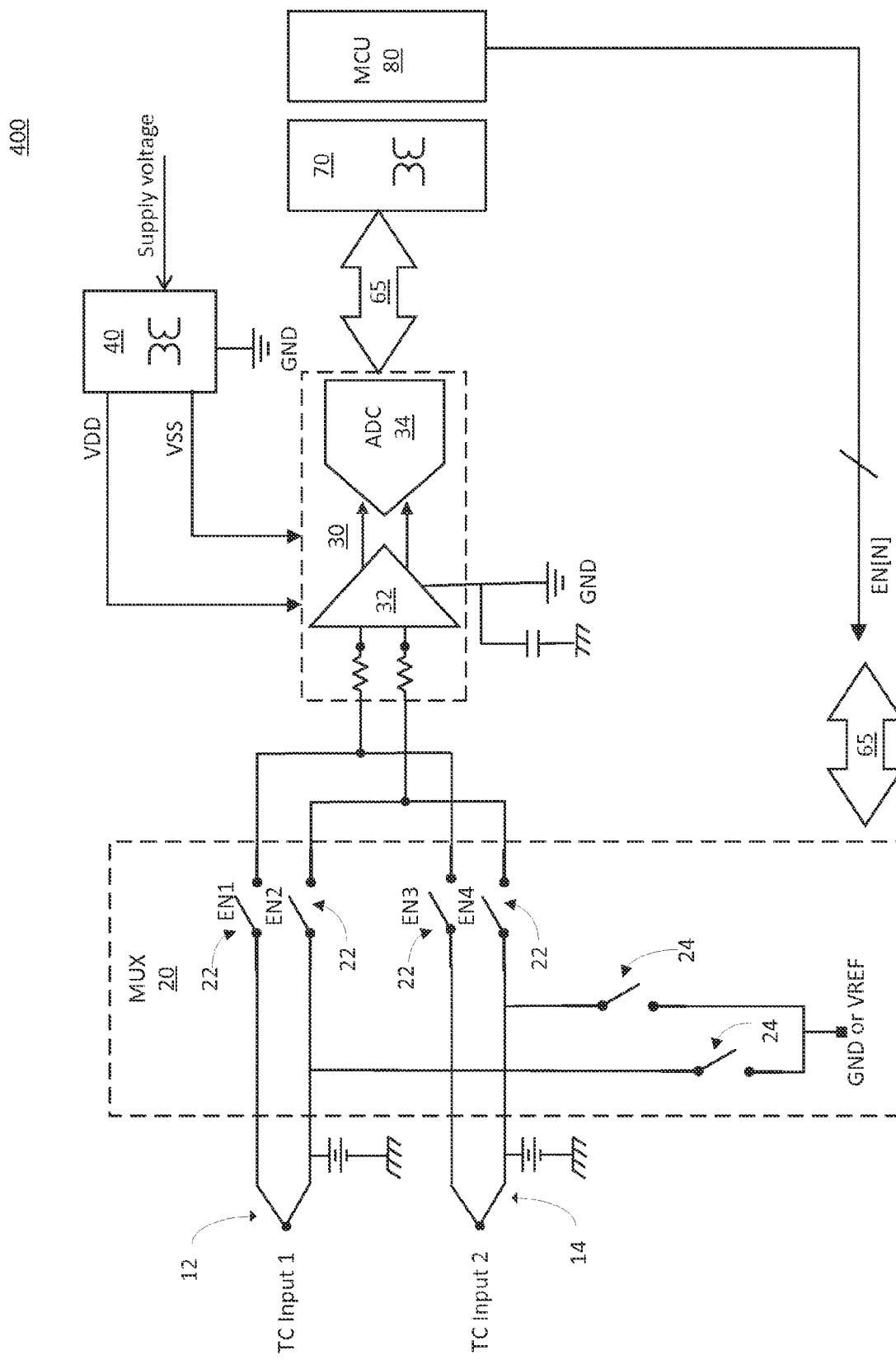
FIG. 5 shows another example embodiment of a system according to the present invention.

FIG. 5 shows an example embodiment of a system 400 according to the present invention. The system 400 is similar to the system 100 of FIG. 1, but differs in some respects. The system 400 does not include the common mode detector 50. Additionally, only one switch 24 is included per channel, in contrast to FIG. 1, where each line of each channel includes a switch 24. Further, each switch 24 may be connected to either GND or a reference voltage VREF. VREF can be used to bias each input channel at a specific voltage. This is useful for systems where VSS is equal to GND. For example, if VDD=5 V and VSS=GND=0V, the system can be biased to 2.5 V to center the voltages of the input channels 12/14 within the supply voltage range of the system. The other GNDs shown in FIG. 1 would remain the same. Therefore, replacing GND with VREF in the above described manner does not change the fact that the control signals for the switches 22 are referenced to GND. The optional use of VREF may be reflected in FIG. 2 by replacing GND (shown at the bottom of transistors mn26 and mp21 and at inputs of i5 and i6) with a corresponding signal "GND or VREF."

An example of how the system 400 operates is as follows. To change from TC input 1 to TC input 2, the switch 22 for input 1 and the switch 24 for input 1 are turned off. Next, the switch 24 for input 2 is turned on to move GND towards the CMV of channel 14. In response to detecting that GND is approximately equal to the CMV, the MUX 20 turns on the switch 22 for input 2. The switch 24 for input 2 remains turned on so as to continuously track the CMV, similar to the common mode detector 50 in FIG. 1.

Figure 6:
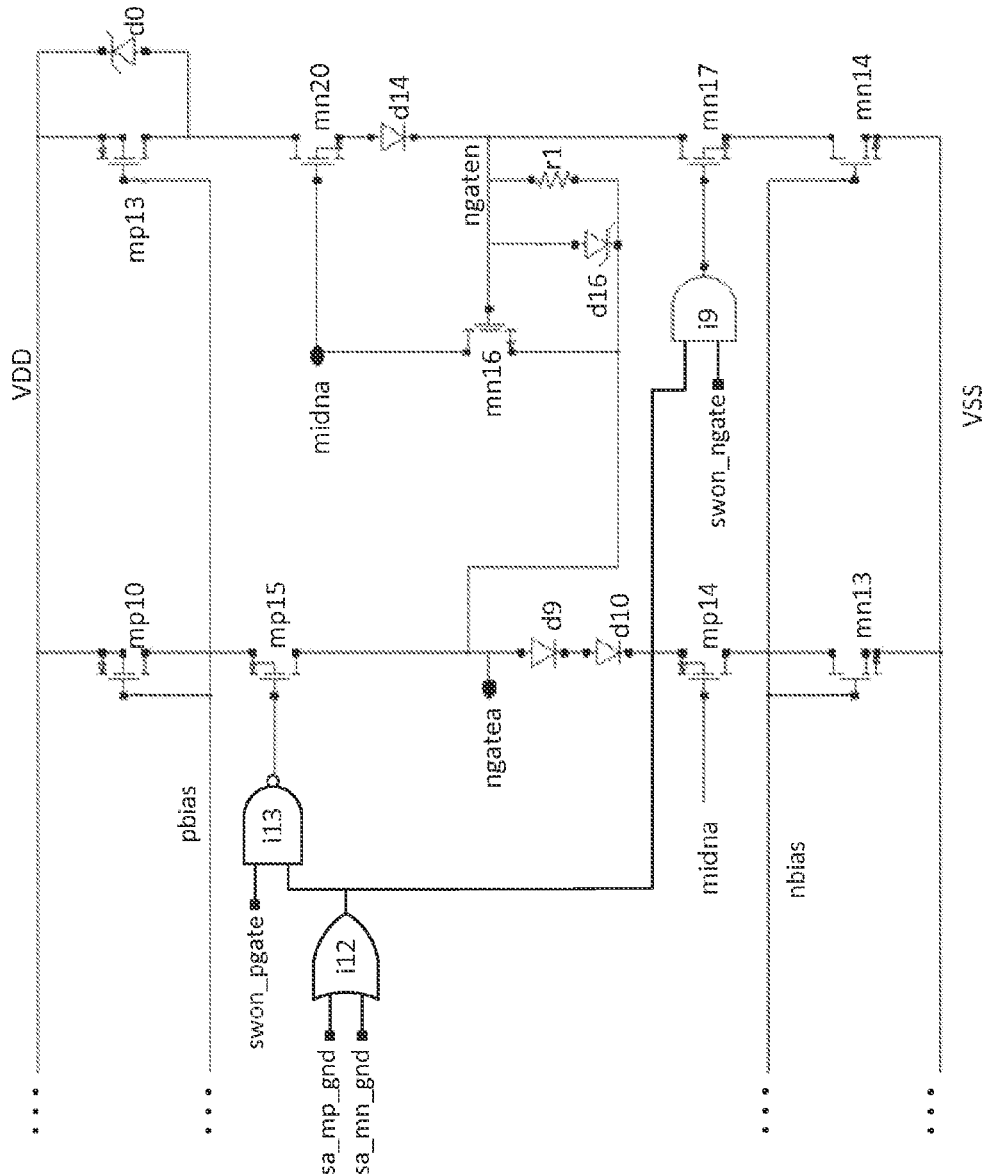
FIG. 6 shows another example embodiment of a switch driver according to the present invention.

FIG. 6 shows an example embodiment of a switch driver 412 according to the present invention. The driver 412 is similar to the driver 212 of FIG. 3, but differs with respect to the control logic for the transistors mp15 and mn17. The signals sa_mp_gnd and sa_mn_gnd are input to an OR gate i12, the output of which forms an input to a NAND gate i13. A second input of NAND gate i13 is the signal swonpgate. The output of i13 is the gate input of mp15. The output of OR gate i12 also forms an input to an AND gate i9. A second input of the AND gate i9 is the signal swon_ngate. The output of i9 is the gate input of mn17.

The embodiments described herein may be presented combined with each other in various combinations. The specification and drawings are accordingly to be regarded in an illustrative rather than restrictive sense.

What is claimed is:

1. A circuit for connecting a plurality of input channels that are at different voltages to a receiving device, the circuit comprising:
   a plurality of switches, each of which connects a respective one of the input channels to the receiving device in response to a respective control signal, wherein the control signals are referenced to a ground signal, and wherein each input channel includes a common mode voltage that is non-referenced to the ground signal; and
   a switch driver that generates the control signals such that the input channels are activated one at a time.

2. The circuit of claim 1, wherein a floating supply voltage referenced to the ground signal is a power signal of the receiving device.

3. The circuit of claim 1, wherein the switch driver waits until the ground signal is at a voltage approximately equal to the common mode voltage of a selected input channel before activating a switch corresponding to the selected input channel.

4. The circuit of claim 3, further comprising:
a detecting circuit that compares the input of the respective input channel to the ground signal and determines, based on the comparison, whether the ground signal is at a voltage approximately equal to the common mode voltage of the selected input channel.

5. The circuit of claim 4, wherein the detecting circuit includes a comparator that determines whether the ground signal is above the common mode voltage, and a comparator that determines whether the ground signal is below the common mode voltage.

6. The circuit of claim 3, further comprising:
a circuit that adjusts the ground signal towards the common mode voltage of the selected input channel.

7. The circuit of claim 6, wherein the circuit that adjusts the ground signal includes:
a PDMOS transistor that adjusts the ground signal when the common mode voltage is negative relative to the ground signal; and
an NDMOS transistor that adjusts the ground signal when the common mode voltage is positive relative to the ground signal.

8. The circuit of claim 1, wherein the switch driver activates the switches without regard for whether the ground signal is at a voltage approximately equal to the common mode voltage of the respective input channel corresponding to the switch being activated.

9. The circuit of claim 8, wherein each switch includes a parasitic path by which the switch driver pulls a positive supply voltage, which is derived relative to the ground signal and used as a power signal by the switch driver, towards the common mode voltage when activating the switch.

10. The circuit of claim 1, further comprising:
a controller that outputs an encoded signal that selects which one of the switches is activated by the switch driver; and
decoding logic that decodes the encoded signal to command the switch driver to generate the control signal that activates the selected switch.

11. The circuit of claim 1, wherein the switch driver generates the control signals such that the switches are activated one at a time.

12. A system for connecting a plurality of input channels that are at different voltages to a receiving device that is referenced to a ground signal, comprising:
the receiving device;
a plurality of input channels, wherein each input channel includes a common mode voltage that is non-referenced to the ground signal; and
a circuit that connects the input channels to the receiving device, the circuit comprising:
a plurality of switches, each of which connects a respective one of the input channels to the receiving device in response to a respective control signal, wherein the control signals are referenced to the ground signal; and
a switch driver that generates the control signals such that the input channels are activated one at a time.

13. The system of claim 12, wherein a floating supply voltage referenced to the ground signal is a power signal of the receiving device.

14. The system of claim 12, wherein the switch driver waits until the ground signal is at a voltage approximately equal to the common mode voltage of a selected input channel before activating a switch corresponding to the selected input channel.

15. The system of claim 14, wherein the circuit further comprises:
a detecting circuit that compares the input of the respective input channel to the ground signal and determines, based on the comparison, whether the ground signal is at a voltage approximately equal to the common mode voltage of the selected input channel.

16. The system of claim 15, wherein the detecting circuit includes a comparator that determines whether the ground signal is above the common mode voltage, and a comparator that determines whether the ground signal is below the common mode voltage.

17. The system of claim 14, wherein the circuit further comprises:
a circuit that adjusts the ground signal towards the common mode voltage of the selected input channel.

18. The system of claim 17, wherein the circuit that adjusts the ground signal includes:
a PDMOS transistor that adjusts the ground signal when the common mode voltage is negative relative to the ground signal; and
an NDMOS transistor that adjusts the ground signal when the common mode voltage is positive relative to the ground signal.

19. The system of claim 12, wherein the switch driver activates the switches without regard for whether the ground signal is at a voltage approximately equal to the common mode voltage of the respective input channel corresponding to the switch being activated.

20. The system of claim 19, wherein each switch includes a parasitic path by which the switch driver pulls a positive supply voltage, which is derived relative to the ground signal and used as a power signal by the switch driver, towards the common mode voltage when activating the switch.

21. The system of claim 12, wherein the circuit further comprises:
a controller that outputs an encoded signal that selects which one of the switches is activated by the switch driver; and
decoding logic that decodes the encoded signal to command the switch driver to generate the control signal that activates the selected switch.

22. The system of claim 12, wherein the switch driver generates the control signals such that the switches are activated one at a time.

23. The system of claim 12, wherein the switches are DMOS switches.

24. The circuit of claim 1, wherein the switches are DMOS switches.

25. A method for switching between a plurality of input channels that are at different voltages, comprising:
adjusting a ground signal towards a common mode voltage of a selected input channel, wherein the common mode voltage is non-referenced to the ground signal; and
activating a switch using a control signal that is referenced to the ground signal after the adjusting, such that the selected input channel becomes connected to a receiving device.

26. The method of claim 25, further comprising:
waiting until the ground signal is at a voltage approximately equal to the common mode voltage of the selected input channel before activating the switch.

27. The method of claim 25, wherein the adjusting of the ground signal is performed by one of:
activating the switch to pull a positive supply voltage, which is derived relative to the ground signal and used as a power signal by a switch driver that generates the control signal, towards the common mode voltage along a parasitic path; and using DMOS transistors.

* * * * *